US012727365B2

(12) United States Patent
Lee

(10) Patent No.: US 12,727,365 B2

(45) Date of Patent: Sep. 1, 2026

(54) DISPLAY DEVICE

(71) Applicant: Samsung Display Co., LTD., Yongin-si (KR)

(72) Inventor: Gwangtaek Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 466 days.

(21) Appl. No.: 18/450,236

(22) Filed: Aug. 15, 2023

(65) Prior Publication Data

US 2024/0172526 A1 May 23, 2024

(30) Foreign Application Priority Data

Nov. 22, 2022 (KR) ........................ 10-2022-0157273

(51) Int. Cl.
*H10K 59/80* (2023.01)
*H10K 59/12* (2023.01)

(52) U.S. Cl.
CPC ....... *H10K 59/8723* (2023.02); *H10K 59/875* (2023.02); *H10K 59/12* (2023.02)

(58) Field of Classification Search
CPC ... H10K 59/8723; H10K 59/875; H10K 59/12
See application file for complete search history.

(56) References Cited

U.S. PATENT DOCUMENTS 7,019,824 B2 3/2006 Wegmann et al.
9,354,476 B2 * 5/2016 Han ...................... G06F 1/1616
12,346,153 B2 * 7/2025 Kim ...................... G06F 1/1616
12,379,748 B2 * 8/2025 Lee ...................... G06F 1/1652
12,426,156 B2 * 9/2025 Kim ...................... H05K 1/0278
12,477,937 B2 * 11/2025 Choi ...................... H10K 50/865
2018/0217639 A1 * 8/2018 Jones ...................... G06F 1/1616
2021/0242432 A1 * 8/2021 Lee ...................... H10K 59/121
(Continued)

FOREIGN PATENT DOCUMENTS

CN 111081744 A 4/2020
CN 114335072 A 4/2022
(Continued)

OTHER PUBLICATIONS

Wu et al., CN 111462622, Jul. 28, 2020 (Year: 2020).*
Kwon et al., CN 114677912, Jun. 28, 2022 (Year: 2022).*

*Primary Examiner* — Mary Ellen Bowman
(74) *Attorney, Agent, or Firm* — Womble Bond Dickinson (US) LLP

(57) ABSTRACT

A display device includes: a substrate including a folding area and a non-folding area adjacent to the folding area; a plurality of first pixels in the folding area and each having a first light emitting area; a plurality of second pixels in the non-folding area and each having a second light emitting area having a size that is different from a size of the first light emitting area; and a window on the first and second pixels and including a plurality of grooves repeatedly arranged along a first direction in the folding area, and wherein each of the grooves includes a first groove formed from a first surface of the window toward a second surface of the window facing the first surface and a second groove formed from the second surface toward the first surface, and the first groove and the second groove are alternately arranged.

19 Claims, 12 Drawing Sheets

(56) References Cited

U.S. PATENT DOCUMENTS

| | | | | |
|---|---|---|---|---|
| 2021/0315116 | A1* | 10/2021 | Sunwoo | B32B 27/38 |
| 2022/0209165 | A1* | 6/2022 | Hyun | H10K 59/871 |

FOREIGN PATENT DOCUMENTS

| | | | | | |
|---|---|---|---|---|---|
| CN | 114387875 | A | | 4/2022 | |
| KR | 20140104844 | A | * | 8/2014 | H10K 77/111 |
| KR | 10-2018-0121750 | A | | 11/2018 | |

* cited by examiner

10
PX2
SPX32 SPX12 SPX22
LA2
NDA
DA
DR1
DR2
DR3
II
II'
SPX21
SPX11
SPX31
PX1
A
NFA
I
FA
LA1
I'
NFA
SPX22
SPX12
SPX32
PX2
LA2

B
OC
DP
BFR
TFE
PDL
IL3
IL2
IL1
SUB
LD1
PE1 EL1 CE
LD2
PE2 EL2 CE
LD3
PE3 EL3 CE
DE1 AP1 GE1 SE1
TR1
DE2 AP2 GE2 SE2
TR2
DE3 AP3 GE3 SE3
TR3
PX1
SPX11 LD1 TR1
SPX21 LD2 TR2
SPX31 LD3 TR3
DR3
DR1

DISPLAY DEVICE

CROSS-REFERENCE TO RELATED APPLICATION(S)

The present application claims priority to and the benefit of Korean Patent Application No. 10-2022-0157273 filed on Nov. 22, 2022, in the Korean Intellectual Property Office (KIPO), the entire disclosure of which is incorporated herein by reference.

BACKGROUND

1. Field

Aspects of some embodiments relate to a display device.

2. Description of the Related Art

Unlike a flat panel display, a flexible display device may generally be folded, bent, or rolled like paper, without damaging the structure or functionality of the flexible display device. The flexible display device may be relatively easy to carry, and may improve user convenience.

Recently, among flexible display devices, a foldable display device is in a spotlight. The foldable display device may be repeatedly folded or unfolded. The foldable display device may include a display panel having a flexible property and a cover window for protecting the display panel. In this case, the cover window of the foldable display device should also have a flexible property so that it is not damaged even if folded or unfolded repeatedly.

The above information disclosed in this Background section is only for enhancement of understanding of the background and therefore the information discussed in this Background section does not necessarily constitute prior art.

SUMMARY

Aspects of some embodiments relate to a display device. For example, aspects of some embodiments relate to a foldable display capable of displaying images.

Aspects of some embodiments include a display device with relatively improved display quality A display device according to some embodiments of the present disclosure includes a substrate including a folding area and a non-folding area adjacent to the folding area, a plurality of first pixels in the folding area on the substrate and each having a first light emitting area, a plurality of second pixels in the non-folding area on the substrate and each having a second light emitting area having a size that is different from a size of the first light emitting area, and a window on the first and second pixels and including a plurality of grooves repeatedly arranged along a first direction in the folding area. Each of the grooves includes a first groove formed from a first surface of the window toward a second surface of the window facing the first surface and a second groove formed from the second surface toward the first surface, and the first groove and the second groove are alternately arranged.

According to some embodiments, the size of the first light emitting area may be larger than the size of the second light emitting area.

According to some embodiments, a width in the first direction of the first light emitting area may be greater than a width in the first direction of each of the grooves.

According to some embodiments, an interval at which the first pixels are spaced may gradually decrease toward the non-folding area.

According to some embodiments, the display device may further include a plurality of diffraction patterns on the first pixels and spaced apart from each other.

According to some embodiments, an interval at which the diffraction patterns are spaced may gradually increase toward the non-folding area.

According to some embodiments, heights of the diffraction patterns adjacent to the non-folding area may be different from each other.

According to some embodiments, the diffraction patterns may be on the first surface of the window.

According to some embodiments, the display device may further include an encapsulation layer between the first and second pixels and the window.

According to some embodiments, the display device may further include a buffer layer between the encapsulation layer and the window.

A display device according to some embodiments of the present disclosure includes a substrate including a folding area and a non-folding area adjacent to the folding area, a plurality of diffraction patterns in the folding area on the substrate and spaced apart from each other, and a window on the substrate and including a plurality of grooves repeatedly arranged along a first direction in the folding area. Each of the grooves includes a first groove formed from a first surface of the window toward a second surface of the window facing the first surface and a second groove formed from the second surface toward the first surface, and the first groove and the second groove are alternately arranged.

According to some embodiments, an interval at which the diffraction patterns are spaced may gradually increase toward the non-folding area.

According to some embodiments, heights of the diffraction patterns adjacent to the non-folding area may be different from each other.

According to some embodiments, the diffraction patterns may be on the first surface of the window.

According to some embodiments, the display device may further include a plurality of first pixels in the folding area on the substrate and each having a first light emitting area, and a plurality of second pixels in the non-folding area on the substrate and each having a second light emitting area having a size that is different from a size of the first light emitting area.

According to some embodiments, the size of the first light emitting area may be larger than the size of the second light emitting area.

According to some embodiments, a width in the first direction of the first light emitting area may be greater than a width in the first direction of each of the grooves.

According to some embodiments, an interval at which the first pixels are spaced may gradually decrease toward the non-folding area.

According to some embodiments, the display device may further include an encapsulation layer between the substrate and the window.

According to some embodiments, the display device may further include a buffer layer between the encapsulation layer and the window.

In a display device according to some embodiments of the present disclosure, the display device may include first pixels in a folding area, second pixels in a non-folding area, diffraction patterns in the folding area, and a window including grooves in the folding area. A light emitting area of the first pixel may be larger than a light emitting area of the second pixel, and a width of the light emitting area of the first pixel in a first direction may be greater than a width of the groove in the first direction. Accordingly, a moire phenomenon in the folding area may be relatively improved. In addition, because the diffraction patterns are located on the first pixels in the folding area, a resolution degradation problem of the folding area may be relatively improved. In addition, it may be possible to prevent or reduce instances of users recognizing or perceiving a boundary between the folding area and the non-folding area by selectively changing an interval of the diffraction patterns, an interval of the first pixels and heights of the diffraction patterns. Accordingly, a display quality of the display device may be relatively improved.

DETAILED DESCRIPTION

Figure 1:
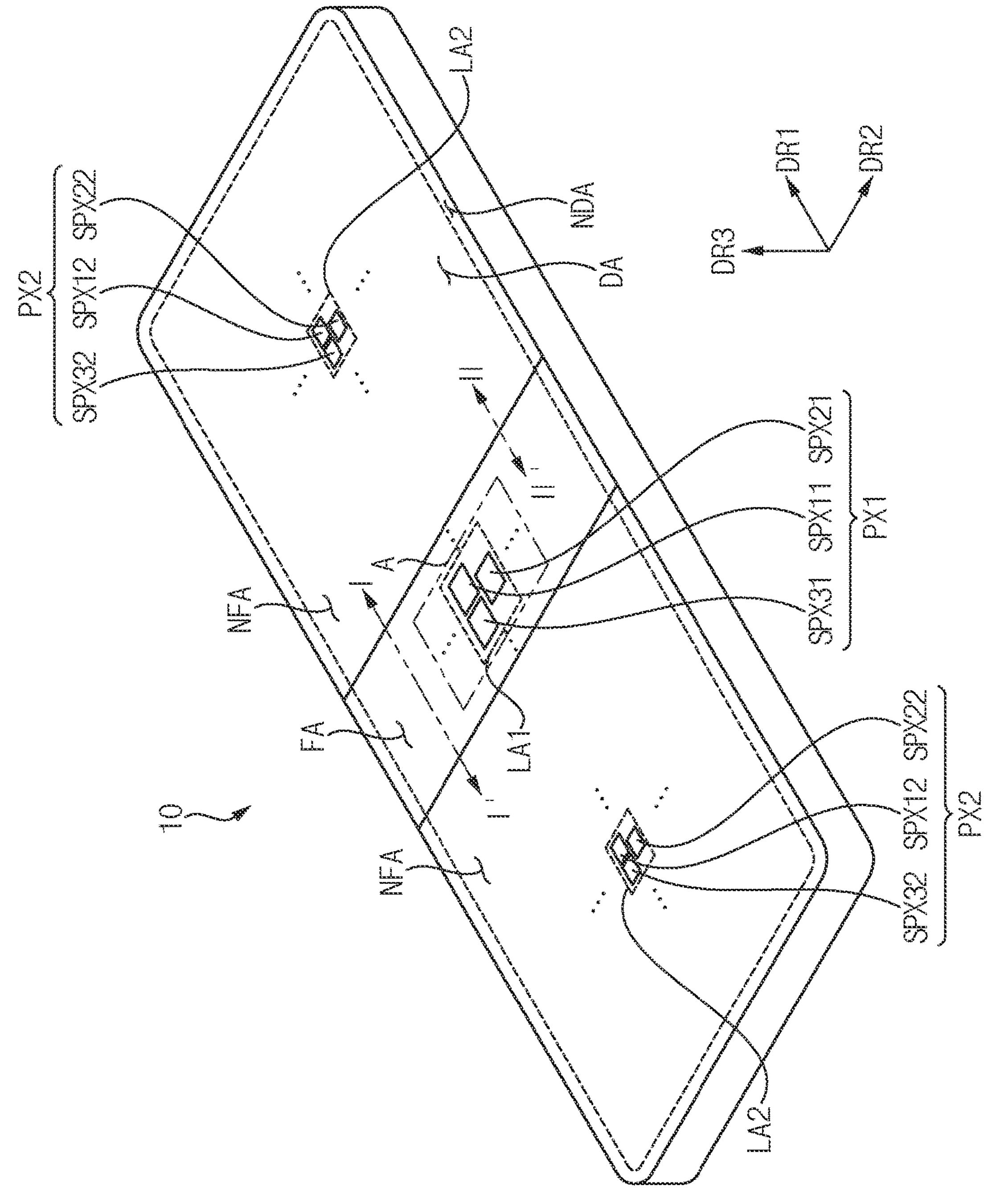
FIGS. 1 and 2 are perspective views illustrating a display device according to some embodiments of the present disclosure.

Hereinafter, aspects of some embodiments of the present disclosure will be described in more detail with reference to the accompanying drawings. The same reference numerals are used for the same components in the drawings, and redundant descriptions of the same components will be omitted.

Figure 2:
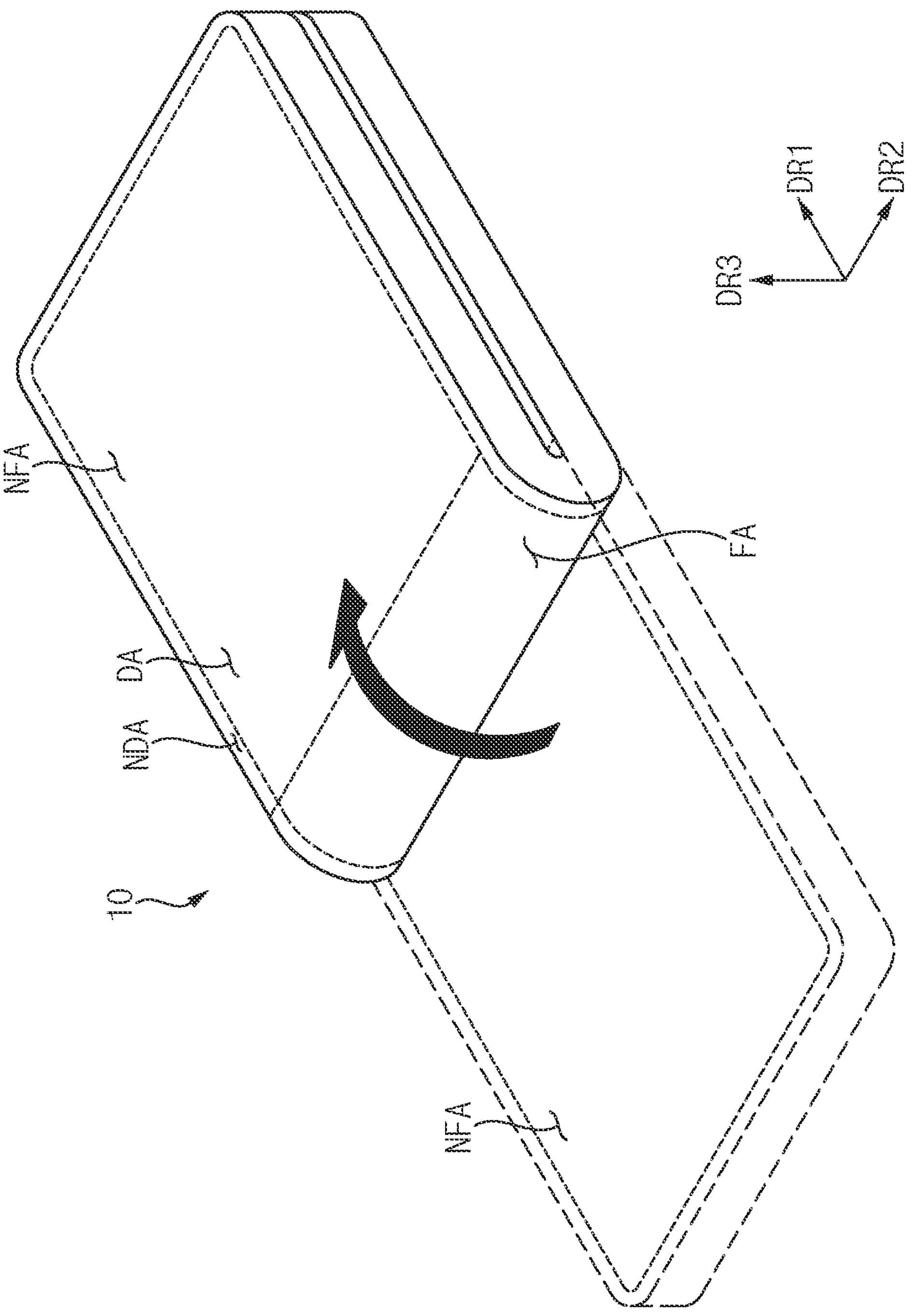

FIGS. 1 and 2 are perspective views illustrating a display device according to some embodiments of the present disclosure.

Referring to FIGS. 1 and 2, a display device 10 may include a display area DA and a non-display area NDA.

The display area DA may be an area capable of displaying images by generating light. A plurality of pixels that emit light may be located in the display area DA, and thus the images may be displayed in the display area DA. The pixels may be arranged in a matrix form or arrangement along a first direction DR1 and a second direction DR2 crossing the first direction DR1. For example, the second direction DR2 may be perpendicular to the first direction DR1. In this case, in the display area DA, the image may be displayed in a third direction DR3 perpendicular (or normal) to a plane defined by, or parallel to, each of the first direction DR1 and second direction DR2.

The non-display area NDA may be an area not displaying images. The non-display area NDA may surround at least a portion of the display area DA. For example, the non-display area NDA may entirely surround (e.g., in a periphery or outside a footprint of) the display area DA.

The display device 10 may be a foldable display device. The display device 10 may include a non-folding area NFA and a folding area FA depending on whether the display device 10 is folded. According to some embodiments, there may be a plurality of non-folding areas NFA. According to some embodiments, the non-folding areas NFA may be spaced apart from each other, and the folding area FA may be positioned between the non-folding areas NFA. Additionally, although FIG. 1 illustrates a single folding area FA and two non-folding areas NFA, embodiments according to the present disclosure are not limited thereto. For example, in some embodiments, the display device 10 may include 2 or more folding areas FA, and 3 or more non-folding areas NFA, such that the display device 10 may be folded along multiple folding axes, at multiple locations, and in multiple orientations, and the like.

The folding area FA may be an area at which the display device 10 is folded, and the non-folding area NFA may be an area at which the display device 10 is not folded. The display device 10 may be folded so that the non-folding areas NFA face each other based on the folding area FA. According to some embodiments, the folding area FA may be folded to have a curvature (e.g., around a folding axis) in a folded position.

A plurality of first pixels PX1 may be located in the folding area FA, and a plurality of second pixels PX2 may be located in the non-folding area NFA.

Each of the first pixels PX1 and the second pixels PX2 may include a plurality of sub-pixels. For example, each of the first pixels PX1 may include a first sub-pixel SPX11, a second sub-pixel SPX21 and a third sub-pixel SPX31. Each of the second pixels PX2 may include a first sub-pixel SPX12, a second sub-pixel SPX22 and a third sub-pixel SPX32.

Each of the first pixels PX1 may have a first light emitting area LA1, and each of the second pixels PX2 may have a second light emitting area LA2. The first light emitting area LA1 may be an area at which light emitted from each of the first pixels PX1 is emitted to an outside of the display device 10 (e.g., toward the third direction DR3). The second light emitting area LA2 may be an area in which light emitted from each of the second pixels PX2 is emitted to the outside of the display device 10 (e.g., toward the third direction DR3).

According to some embodiments, a size of the first light emitting area LA1 may be different from a size of the second light emitting area LA2. For example, the size of the first light emitting area LA1 may be larger than the size of the second light emitting area LA2.

Although FIGS. 1 and 2 illustrate that the display device 10 includes one folding area FA and is folded once, embodiments according to the present disclosure are not limited thereto. For example, the display device 10 may include two or more folding areas and be folded two or more times.

In addition, although FIGS. 1 and 2 illustrate that the folding area FA extends in the second direction DR2 and the display device 10 is folded in the first direction DR1, embodiments according to the present disclosure are not limited thereto. For example, the folding area FA may extend in the first direction DR1 and the display device 10 may be folded in the second direction DR2.

Figure 3:
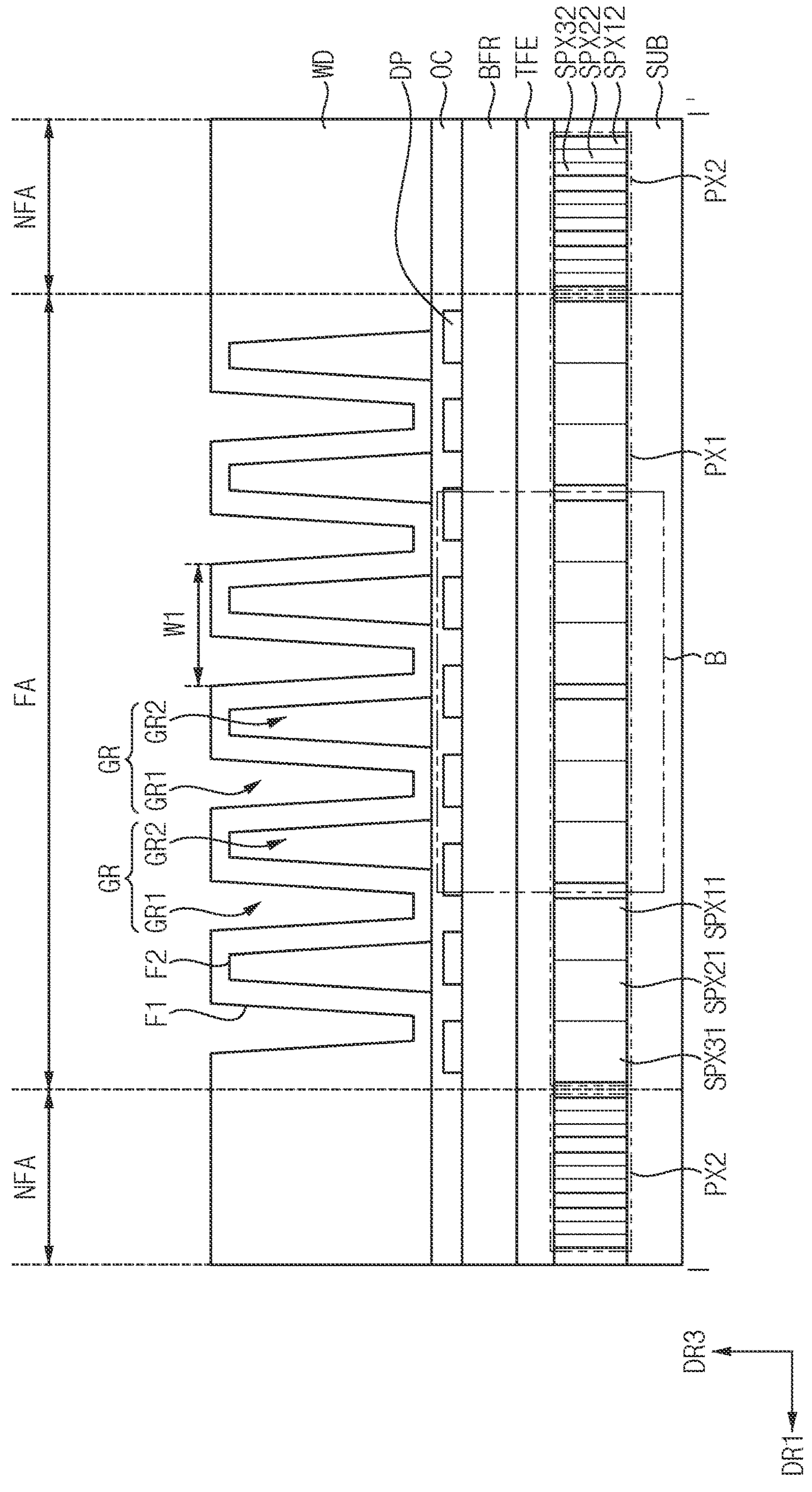
FIG. 3 is a cross-sectional view taken along the line I-I' of FIG. 1 according to some embodiments of the present disclosure.
Figure 4:
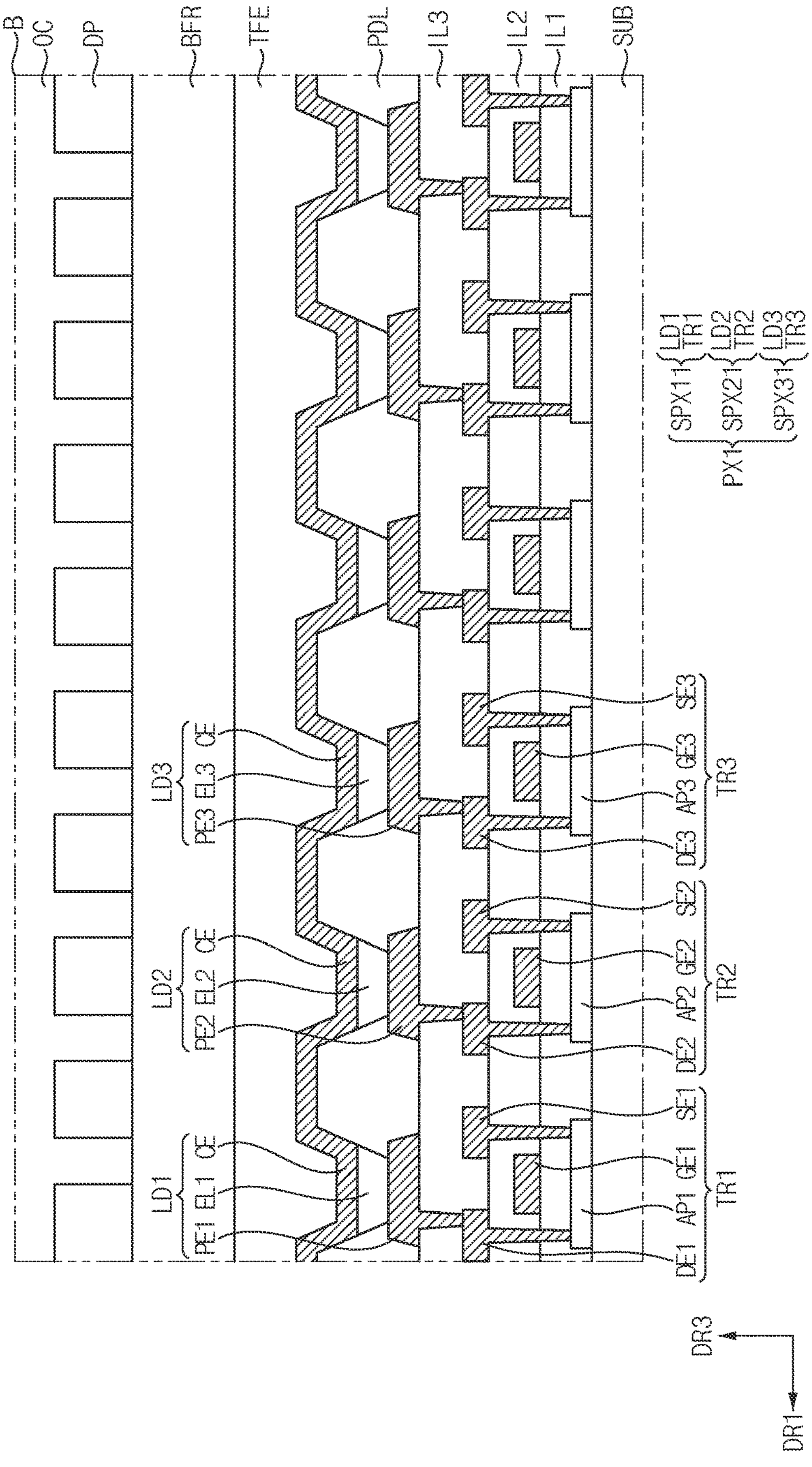
FIG. 4 is an enlarged plan view of the area B of FIG. 3 according to some embodiments of the present disclosure.

FIG. 3 is a cross-sectional view taken along the line I-I' of FIG. 1. FIG. 4 is an enlarged plan view of the area B of FIG. 3. For example, FIG. 3 may be a cross-sectional view illustrating the display area DA of each of the folding area FA and the non-folding area NFA, and FIG. 4 may be a cross-sectional view illustrating the display area DA of the folding area FA.

According to some embodiments, the cross-sectional structure of the second pixels PX2 may be substantially similar to that of the first pixels PX1.

Referring to FIGS. 1, 3 and 4, the display device 10 may include a substrate SUB, first, second and third transistors TR1, TR2 and TR3, a first insulating layer IL1, a second insulating layer IL2, a third insulating layer IL3, a pixel defining layer PDL, first, second and third light emitting elements LD1, LD2 and LD3, an encapsulation layer TFE, a buffer layer BFR, a plurality of diffraction patterns DP, an over-coating layer OC and a window WD.

The first transistor TR1 may include a first active pattern AP1, a first gate electrode GE1, a first source electrode SE1 and a first drain electrode DE1. The second transistor TR2 may include a second active pattern AP2, a second gate electrode GE2, a second source electrode SE2 and a second drain electrode DE2. The third transistor TR3 may include a third active pattern AP3, a third gate electrode GE3, a third source electrode SE3 and a third drain electrode DE3.

The first light emitting element LD1 may include a first pixel electrode PE1, a first light emitting layer EL1 and a common electrode CE. The second light emitting element LD2 may include a second pixel electrode PE2, a second light emitting layer EL2 and the common electrode CE. The third light emitting element LD3 may include a third pixel electrode PE3, a third light emitting layer EL3 and the common electrode CE.

The substrate SUB may include a transparent material or an opaque material. Examples of materials that may be used as the substrate SUB may include polyimide, quartz, glass, and the like. These may be used alone or in combination with each other.

The first, second and third active patterns AP1, AP2 and AP3 may be located on the substrate SUB. Each of the first, second and third active patterns AP1, AP2 and AP3 may have a source area, a drain area and a channel area positioned between the source area and the drain area. Each of the first, second and third active patterns AP1, AP2 and AP3 may include a silicon semiconductor material or an oxide semiconductor material. Examples of silicon semiconductor materials that may be used as each of the first, second and third active patterns AP1, AP2 and AP3 may include amorphous silicon, polycrystalline silicon, and the like. Examples of oxide semiconductor materials that may be used as each of the first, second and third active patterns AP1, AP2 and AP3 may include indium gallium zinc oxide, indium tin zinc oxide, and the like. These may be used alone or in combination with each other.

The first insulating layer IL1 may be located on the first, second and third active patterns AP1, AP2 and AP3. The first insulating layer IL1 may sufficiently cover each of the first, second and third active patterns AP1, AP2 and AP3, and may have a substantially flat upper surface without creating a step around each of the first, second and third active patterns AP1, AP2 and AP3. Optionally, the first insulating layer IL1 may cover each of the first, second and third active patterns AP1, AP2 and AP3, and may be arranged along a profile of each of the first, second and third active patterns AP1, AP2 and AP3 with a uniform thickness. The first insulating layer IL1 may include an inorganic insulating material. Examples of inorganic insulating materials that may be used as the first insulating layer IL1 may include silicon oxide, silicon nitride, silicon oxynitride, and the like. These may be used alone or in combination with each other.

The first, second and third gate electrodes GE1, GE2 and GE3 may be located on the first insulating layer IL1. The first, second and third gate electrodes GE1, GE2 and GE3 may overlap the channel area of each of the first, second and third active patterns AP1, AP2 and AP3. Each of the first, second and third gate electrodes GE1, GE2 and GE3 may include a conductive material. Examples of conductive materials that may be used as each of the first, second and third gate electrodes GE1, GE2 and GE3 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and the like. These may be used alone or in combination with each other.

The second insulating layer IL2 may be located on the first insulating layer IL1. The second insulating layer IL2 may sufficiently cover each of the first, second and third gate electrodes GE1, GE2 and GE3, and may have a substantially flat upper surface without creating a step around each of the first, second and third gate electrodes GE1, GE2 and GE3. Optionally, the second insulating layer IL2 may cover each of the first, second and third gate electrodes GE1, GE2, and GE3, and may be arranged along a profile of each of the first, second and third gate electrodes GE1, GE2, and GE3 with a uniform thickness. The second insulating layer IL2 may include an inorganic insulating material. Examples of inorganic insulating materials that may be used as the second insulating layer IL2 may include silicon oxide, silicon nitride, silicon oxynitride, and the like. These may be used alone or in combination with each other.

The first, second and third source electrodes SE1, SE2 and SE3 and the first, second and third drain electrodes DE1, DE2 and DE3 may be located on the third insulating layer IL3. The first, second and third source electrodes SE1, SE2 and SE3 may be connected to the source area of each of the first, second and third active patterns AP1, AP2 and AP3 through contact holes penetrating portions of the first insulating layer IL1 and the second insulating layer IL2. The first, second and third drain electrodes DE1, DE2 and DE3 may be connected to the drain area of each of the first, second and third active patterns AP1, AP2, and AP3 through contact holes penetrating portions of the first insulating layer IL1 and the second insulating layer IL2. Each of the first, second and third source electrodes SE1, SE2 and SE3 and the first, second and third drain electrodes DE1, DE2 and DE3 may include a conductive material. Examples of conductive materials that may be used as each of the first, second and third source electrodes SE1, SE2 and SE3 and the first, second and third drain electrodes DE1, DE2 and DE3 may include aluminum, platinum, palladium, silver, magnesium, gold, nickel, neodymium, iridium, chromium, lithium, calcium, molybdenum, titanium, tungsten, copper, and the like. These may be used alone or in combination with each other.

Accordingly, the first transistor TR1 including the first active pattern AP1, the first gate electrode GE1, the first source electrode SE1 and the first drain electrode DE1 may be located in the folding area FA on the substrate SUB. The second transistor TR2 including the second active pattern AP2, the second gate electrode GE2, the second source electrode SE2 and the second drain electrode DE2 may be located in the folding area FA on the substrate SUB. The third transistor TR3 including the third active pattern AP3, the third gate electrode GE3, the third source electrode SE3 and the third drain electrode DE3 may be located in the folding area FA on the substrate SUB.

The third insulating layer IL3 may be located on the second insulating layer IL2. The third insulating layer IL3 may sufficiently cover each of the first, second and third source electrodes SE1, SE2 and SE3 and the first, second and third drain electrodes DE1, DE2 and DE3. The third insulating layer IL3 may include an organic insulating material. Examples of organic insulating materials that may be used as the third insulating layer IL3 may include photoresist, polyacrylic resin, polyimide resin, acrylic resin, and the like. These may be used alone or in combination with each other.

The first, second and third pixel electrodes PE1, PE2 and PE3 may be located on the third insulating layer IL3. The first, second and third pixel electrodes PE1, PE2 and PE3 may be connected to each of the first, second and third drain electrodes DE1, DE2 and DE3 of the first, second and third transistors TR1, TR2 and TR3 through contact holes penetrating the third insulating layer IL3. Each of the first, second and third pixel electrodes PE1, PE2 and PE3 may include a conductive material. Examples of conductive materials that may be used as each of the first, second and third pixel electrodes PE1, PE2 and PE3 may include aluminum, platinum, palladium, silver, magnesium, gold, nickel, neodymium, chromium, lithium, calcium, molybdenum, titanium, tungsten, copper, indium tin oxide, indium zinc oxide, and the like. These may be used alone or in combination with each other.

The pixel defining layer PDL may be located on the third insulating layer IL3. An opening exposing at least a portion of each of the first, second and third pixel electrodes PE1, PE2 and PE3 may be defined in the pixel defining layer PDL. The pixel defining layer PDL may include an organic insulating material. Examples of organic insulating materials that may be used as the pixel defining layer PDL may include photoresist, polyacrylic resin, polyimide resin, acrylic resin, and the like. These may be used alone or in combination with each other.

The first, second and third light emitting layers EL1, EL2 and EL3 may be located on the first, second and third pixel electrodes PE1, PE2 and PE3, respectively. According to some embodiments, the first light emitting layer EL1 may be located on the first pixel electrode PE1 exposed by the opening of the pixel defining layer PDL. The second light emitting layer EL2 may be located on the second pixel electrode PE2 exposed by the opening of the pixel defining layer PDL. The third light emitting layer EL3 may be located on the third pixel electrode PE3 exposed by the opening of the pixel defining layer PDL. Each of the first, second and third light emitting layers EL1, EL2 and EL3 may include an organic material, and may emit light of a predetermined color. For example, the first light emitting layer EL1 may emit blue light, the second light emitting layer EL2 may emit green light, and the third light emitting layer EL3 may emit red light. However, embodiments according to the present disclosure are not limited thereto.

The common electrode CE may be located on the first, second and third light emitting layers EL1, EL2 and EL3 and the pixel defining layer PDL. The common electrode CE may include a conductive material. Examples of conductive materials that may be used as the common electrode CE may include aluminum, platinum, silver, magnesium, gold, chromium, tungsten, titanium, and the like. These may be used alone or in combination with each other.

Accordingly, the first light emitting element LD1 including the first pixel electrode PE1, the first light emitting layer EL1 and the common electrode CE may be located in the folding area FA on the substrate SUB. The second light emitting element LD2 including the second pixel electrode PE2, the second light emitting layer EL2 and the common electrode CE may be located in the folding area FA on the substrate SUB. The third light emitting element LD3 including the third pixel electrode PE3, the third light emitting layer EL3 and the common electrode CE may be located in the folding area FA on the substrate SUB. The first, second and third light emitting elements LD1, LD2 and LD3 may emit light based on driving currents transmitted from each of the first, second and third transistors TR1, TR2 and TR3.

The first transistor TR1 and the first light emitting element LD1 may form the first sub-pixels SPX11 and SPX12, respectively. The second transistor TR2 and the second light emitting element LD2 may form the second sub-pixels SPX21 and SPX22, respectively. The third transistor TR3 and the third light emitting element LD3 may form the third sub-pixels SPX31 and SPX32, respectively.

According to some embodiments, each of the first, second and third sub-pixels SPX11, SPX21 and SPX31 included in the first pixels PX1 may emit light of different colors. In addition, each of the first, second and third sub-pixels SPX12, SPX22 and SPX32 included in the second pixels PX2 may emit light of different colors. For example, each of the first sub-pixels SPX11 and SPX12 may emit blue light, each of the second sub-pixels SPX21 and SPX22 may emit green light, and each of the third sub-pixels SPX31 and SPX32 may emit red light. However, embodiments according to the present disclosure are not limited thereto.

Accordingly, the first pixels PX1 including the first sub-pixel SPX11, the second sub-pixel SPX21 and the third sub-pixel SPX31 may be located in the folding area FA on the substrate SUB. In addition, the second pixels PX2 including the first sub-pixel SPX12, the second sub-pixel SPX22 and the third sub-pixel SPX32 may be located in the non-folding area NFA on the substrate SUB.

Sizes of the first pixels PX1 may be larger than sizes of the second pixels PX2. That is, sizes of the first, second and third sub-pixels SPX11, SPX21 and SPX31 included in the first pixels PX1 may be larger than sizes of the first, second and third sub-pixels SPX12, SPX22 and SPX32 included in the second pixels PX2, respectively. According to some embodiments, the size of the first light emitting area LA1 of the first pixels PX1 may be larger than the size of the second light emitting area LA2 of the second pixels PX2. In other words, sizes of the first, second and third light emitting elements LD1, LD2 and LD3 included in the first pixels PX1 may be larger than sizes of the first, second and third light emitting elements LD1, LD2 and LD3 included in the second pixels PX2.

The encapsulation layer TFE may be located on the common electrode CE. The encapsulation layer TFE may prevent or reduce instances of impurities, contaminants, moisture, outside air, and the like from penetrating into each of the first, second and third light emitting elements LD1, LD2 and LD3 from the outside. According to some embodiments, the encapsulation layer TFE may include at least one inorganic layer and at least one organic layer. For example, the encapsulation layer TFE may have a structure in which inorganic layers and organic layers are alternately stacked. The encapsulation layer TFE may include an insulating material. According to some embodiments, the encapsulation layer TFE may be a transparent insulating substrate. For example, the encapsulation layer TFE may be a glass substrate, a quartz substrate, a transparent resin substrate, and the like.

The buffer layer BFR may be located on the encapsulation layer TFE. The buffer layer BFR may adjust a distance between the diffraction patterns DP and the first, second and third light emitting elements LD1, LD2 and LD3. According to some embodiments, the buffer layer BFR may include an inorganic material or an organic material. For example, the buffer layer BFR may include at least one inorganic layer and at least one organic layer. According to some embodiments, the buffer layer BFR may be an air layer. In this case, a special configuration may not be located between the encapsulation layer TFE and the diffraction patterns DP.

The diffraction patterns DP may be arranged to be spaced apart from each other in the folding area FA on the buffer layer BFR. The diffraction patterns DP may protrude from the buffer layer BFR in the third direction DR3. The diffraction patterns DP may overlap the first pixels PX1. According to some embodiments, the diffraction patterns DP may be located on a path of light emitted from the first pixels PX1 in the folding area FA. In other words, the diffraction patterns DP may be located on a path of light emitted from each of the first, second and third sub-pixels SPX11, SPX21 and SPX31 included in the first pixels PX1. The diffraction patterns DP may enlarge a light emitting area by diffracting light emitted from each of the first, second and third sub-pixels SPX11, SPX21 and SPX31. That is, the diffraction patterns DP may enlarge the first light emitting area LA1 of each of the first pixels PX1. This will be described later with reference to FIG. 6.

Although FIGS. 3 and 4 illustrate that the diffraction patterns DP are located on the buffer layer BFR, embodiments according to the present disclosure are not limited thereto. For example, the diffraction patterns DP may be located below the buffer layer BFR.

The over-coating layer OC may be located on the buffer layer BFR. The over-coating layer OC may cover each of the diffraction patterns DP. The over-coating layer OC may include an organic insulating material. Examples of organic insulating materials that may be used as the over-coating layer OC may include photoresist, polyacrylic resin, polyimide-based resin, acrylic resin, and the like. These may be used alone or in combination with each other.

The window WD may be located on the over-coating layer OC. The window WD may block foreign materials penetrating from the outside, and may prevent or reduce instances of impacts applied from the outside being transmitted to components located below the window WD. The window WD may include a first surface F1 and a second surface F2 facing the first surface F1. For example, the first surface F1 may be an upper surface of the window WD, and the second surface F2 may be a lower surface of the window WD.

According to some embodiments, the window WD may include a plurality of grooves GR in the folding area FA. For example, the grooves GR may overlap the diffraction patterns DP. The grooves GR may be repeatedly arranged along the first direction DR1. Each of the grooves GR may include a first groove GR1 and a second groove GR2. For example, the first groove GR1 may be formed from the first surface F1 to the second surface F2, and the second groove GR2 may be formed from the second surface F2 to the first surface F1. The first groove GR1 and the second groove GR2 may be alternately arranged along the first direction DR1.

The grooves GR may be arranged with a predetermined period or spacing between them. In this case, the predetermined period may be a width W1 of each of the grooves GR in the first direction DR1. That is, the predetermined period may be the width W1 of the first groove GR1 and the second groove GR2 in the first direction DR1.

Figure 5:
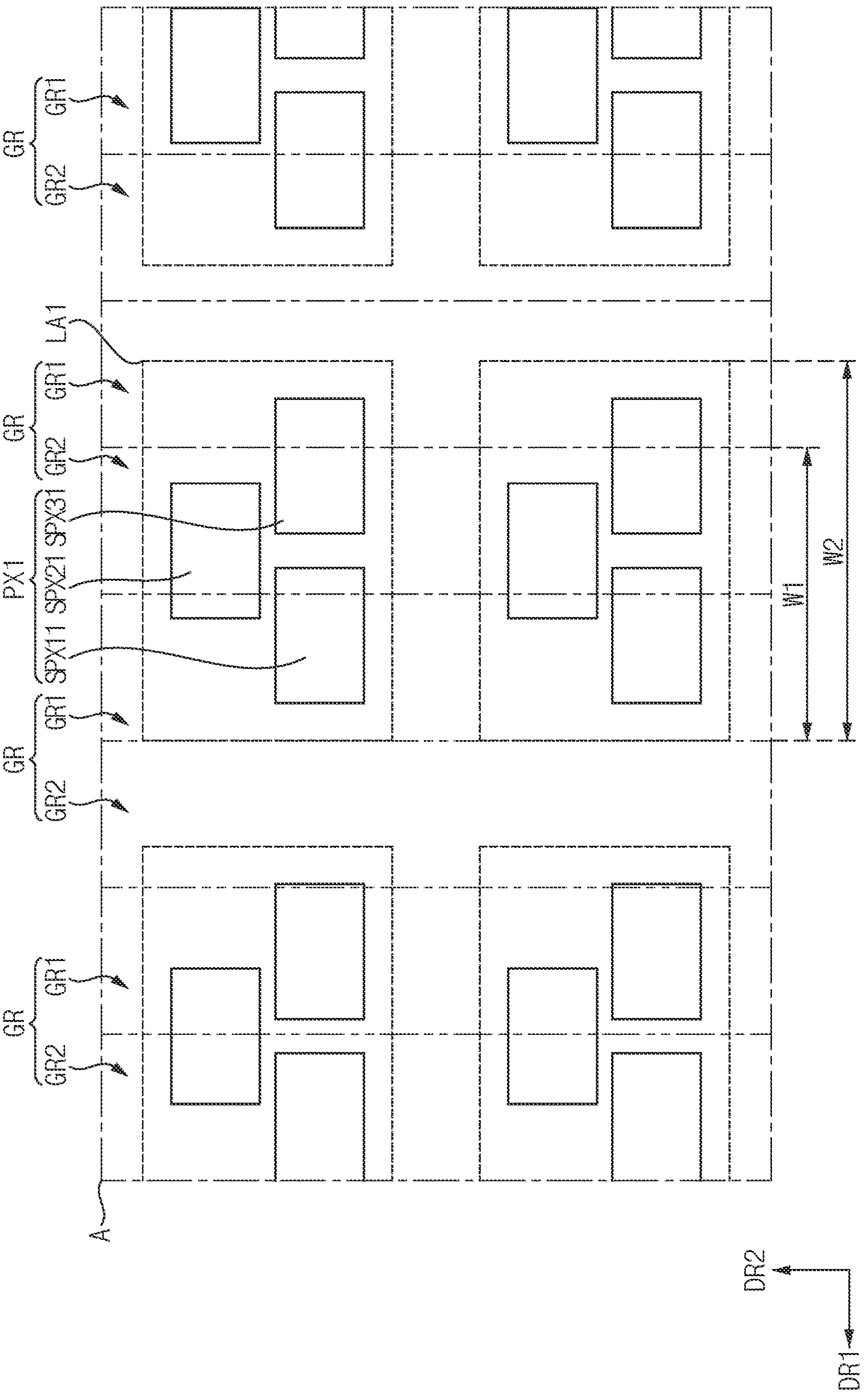
FIG. 5 is an enlarged plan view of the area A of FIG. 1 according to some embodiments of the present disclosure.

FIG. 5 is an enlarged plan view of the area A of FIG. 1. For example, FIG. 5 may be a plan view illustrating the first pixels PX1 and the window WD of the folding area FA.

Referring to FIG. 5, the first pixels PX1 may be arranged along the first direction DR1 and the second direction DR2. Each of the first pixels PX1 may include the first, second and third sub-pixels SPX11, SPX21 and SPX31, and may have the first light emitting area LA1.

The grooves GR may be repeatedly arranged along the first direction DR1. In other words, the first groove GR1 and the second groove GR2 may be alternately arranged along the first direction DR1.

According to some embodiments, a width W2 of the first light emitting area LA1 in the first direction DR1 may be greater than the width W1 of each of the grooves GR in the first direction DR1.

When the width W1 of each of the grooves GR in the first direction DR1 is greater than the width W2 of the first light emitting area LA1 in the first direction DR1, light emitted from the first pixels PX1 may be diffracted to cause a moire phenomenon. In the display device 10 according to some embodiments of the present disclosure, the moire phenomenon may be improved as the width W2 of the first light emitting area LA1 in the first direction DR1 is greater than the width W1 of each of the grooves GR in the first direction DR1.

Figure 6:
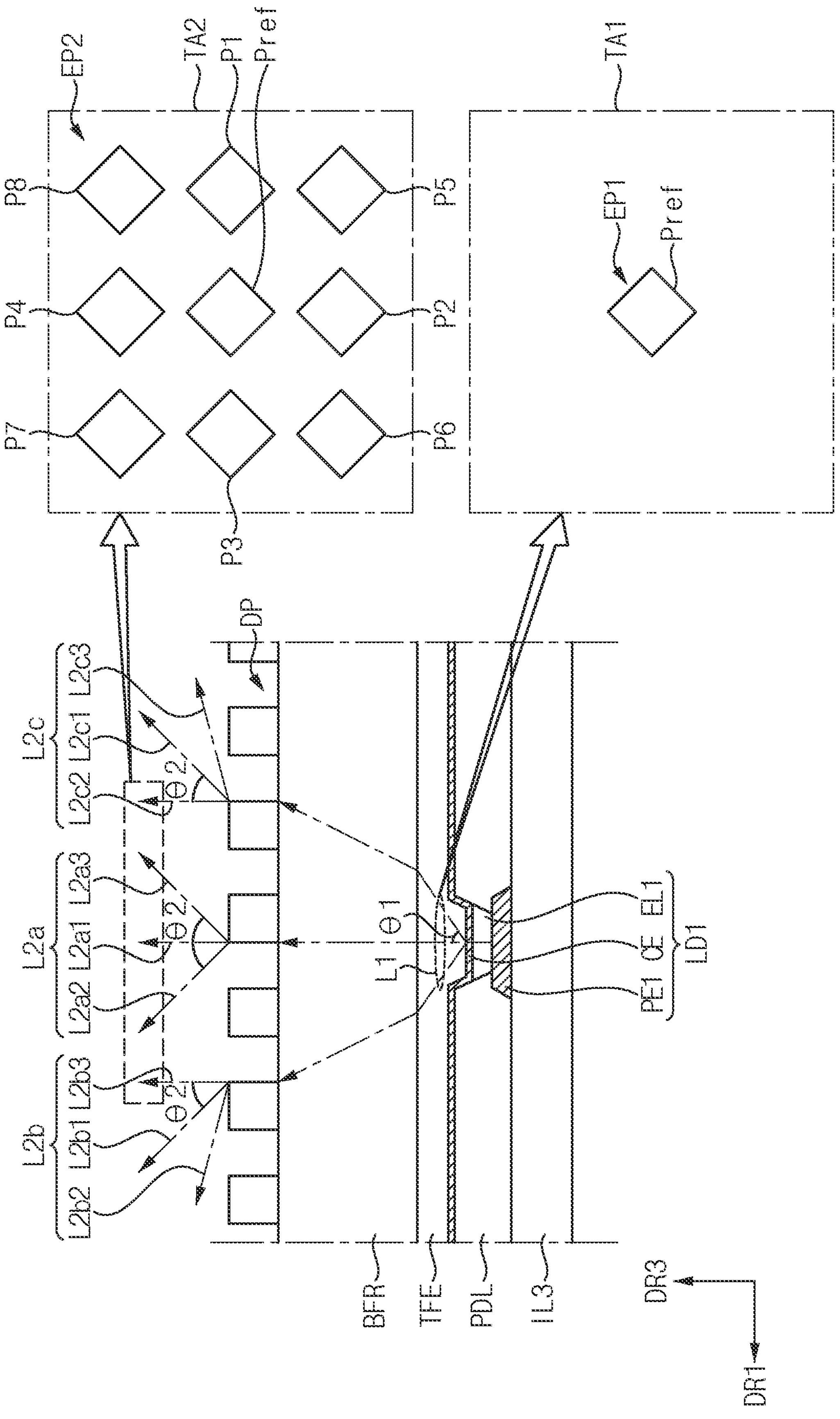
FIG. 6 is a view for explaining expansion of a light emitting area by a diffraction pattern according to some embodiments of the present disclosure.

FIG. 6 is a view for explaining expansion of a light emitting area by a diffraction pattern. For example, FIG. 6 may be a view for explaining that a light emitting area of a light L1 emitted from the first sub-pixel SPX11 is enlarged by the diffraction patterns DP. According to some embodiments, the expansion of the light emitting area by the diffraction patterns DP may be applied substantially the same to the second and third sub-pixels SPX21 and SPX31.

Referring to FIGS. 3 and 6, the light L1 may be emitted from the first sub-pixel SPX11 in the third direction DR3. The light L1 may be emitted while having a first diffraction angle θ1. A first light emitting pattern EP1 may be generated in a first area TA1 by the light L1 emitted from the first sub-pixel SPX11. The first light emitting pattern EP1 may include a reference light emitting pattern Pref.

The light L1 emitted from the first sub-pixel SPX11 may pass through the encapsulation layer TFE and the buffer layer BFR, and may be provided to the diffraction patterns DP. An optical path of the light L1 emitted from the first sub-pixel SPX11 may be changed at a predetermined angle by a refractive index of each of the encapsulation layer TFE and the buffer layer BFR.

The diffraction patterns DP may diffract the light L1 emitted from the first sub-pixel SPX11 to generate first, second and third diffraction lights L2*a*, L2*b* and L2*c*.

Each of the first, second and third diffraction lights L2*a*, L2*b* and L2*c* may include 0th-order and 1st-order diffraction lights. In this case, the 0th-order diffraction light may be light having a same optical path before and after diffraction by the diffraction patterns DP. In addition, the 1st-order diffraction light may be light with a second diffraction angle θ2 based on the 0th-order diffraction light as an optical path is changed by diffraction patterns DP.

For example, 1-1th, 2-1th, and 3-1th diffraction lights L2*a*1, L2*b*1 and L3*c*1 may be the 0th-order diffraction light. In addition, 1-2th, 1-3th, 2-2th, 2-3th, 3-2th, 3-3th diffraction lights L2*a*2, L2*a*3, L2*b*2, L2*b*3, L2*c*2 and L2*c*3 may be the 1st-order diffraction light.

Although FIG. 6 illustrates each of the first, second and third diffraction lights L2*a*, L2*b* and L2*c* includes the 0th-order and the 1st-order diffraction lights, embodiments according to the present disclosure are not limited thereto. For example, each of the first, second and third diffraction lights L2*a*, L2*b* and L2*c* may further include second or higher order diffraction lights.

A second light emitting pattern EP2 may be generated in a second area TA2 by the first, second and third diffraction lights L2*a*, L2*b* and L2*c* emitted from the first sub-pixel SPX11 and passing through the diffraction patterns DP. Areas of the first area TA1 and the second area TA2 may be equal to each other.

As the diffraction patterns DP diffract the light L1 emitted from the first sub-pixel SPX11, the second light emitting pattern EP2 may include the reference light emitting pattern Pref and first to eighth replicated light emitting patterns P1, P2, P3, P4, P5, P6, P7 and P8 replicated from the reference light emitting pattern Pref. In other words, the first area TA1 may include one light emitting pattern, and the second area TA2 may include nine light emitting patterns. That is, an area of the light emitting area of the second area TA2 may be larger than an area of the light emitting area of the first area TA1. Accordingly, the light emitting area of the light L1 emitted from the first sub-pixel SPX11 may be enlarged by the diffraction patterns DP.

Figure 7:
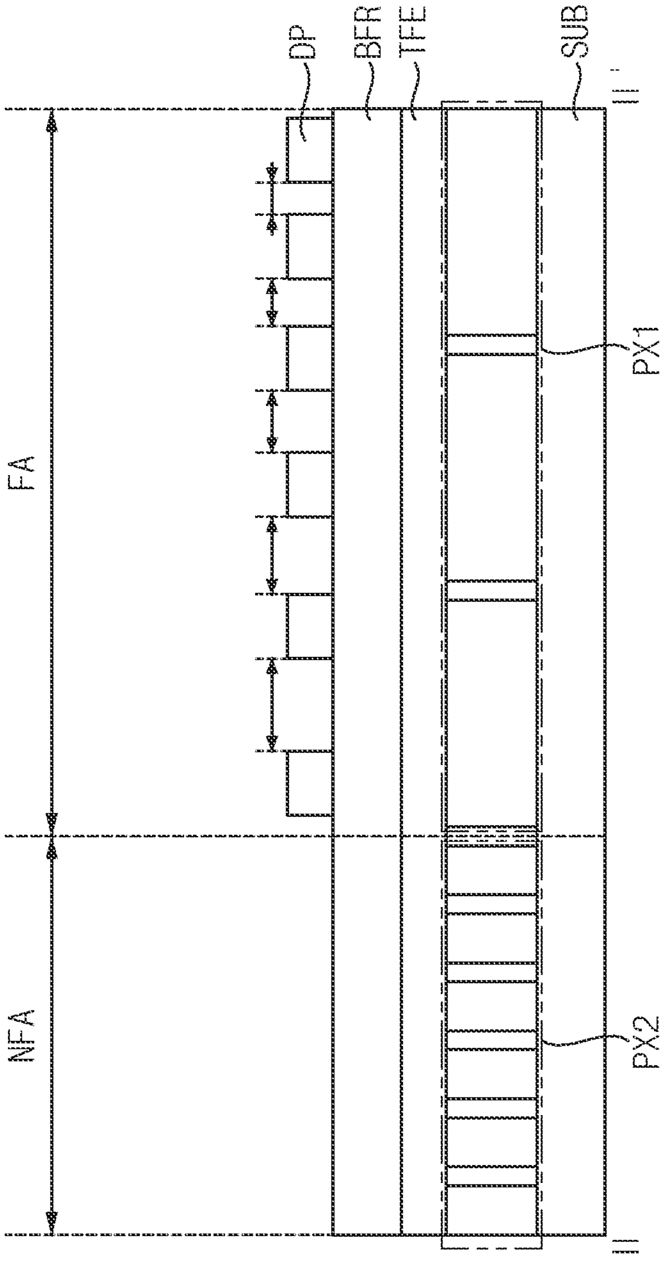
FIG. 7 is an example of a cross-sectional view taken along the line II-II' of FIG. 1 according to some embodiments of the present disclosure.

FIG. 7 is an example of a cross-sectional view taken along the line II-II' of FIG. 1.

Referring to FIGS. 5 and 7, the display device 10 may include the substrate SUB, the first pixels PX1, the second pixels PX2, the encapsulation layer TFE, the buffer layer BFR and the diffraction patterns DP.

Hereinafter, a description overlapping the display device 10 described with reference to FIGS. 3, 4 and 5 will be omitted or simplified.

The diffraction patterns DP may be arranged to be spaced apart from each other in the folding area FA on the buffer layer BFR. The diffraction patterns DP may be located on a path of light emitted from the first pixels PX1 in the folding area FA. According to some embodiments, an interval at which the diffraction patterns DP are spaced may gradually increase as it approaches (e.g., in a direction toward) the non-folding area NFA. In this case, the interval between the diffraction patterns DP may be smaller than the width W2 of the first light emitting area LA1 in the first direction DR1.

As the size of the light emitting area of the first pixels PX1 is larger than the size of the light emitting area of the second pixels PX2 and the diffraction patterns DP are located on the first pixels PX1, a boundary between the folding area FA and the non-folding area NFA may be recognized. The display device 10 according to some embodiments of the present disclosure may prevent or reduce instances of a user recognizing or perceiving the boundary between the folding area FA and the non-folding area NFA by increasing the interval between the diffraction patterns DP in the folding area FA as it approaches (e.g., in a direction toward) the non-folding area NFA.

Figure 8:
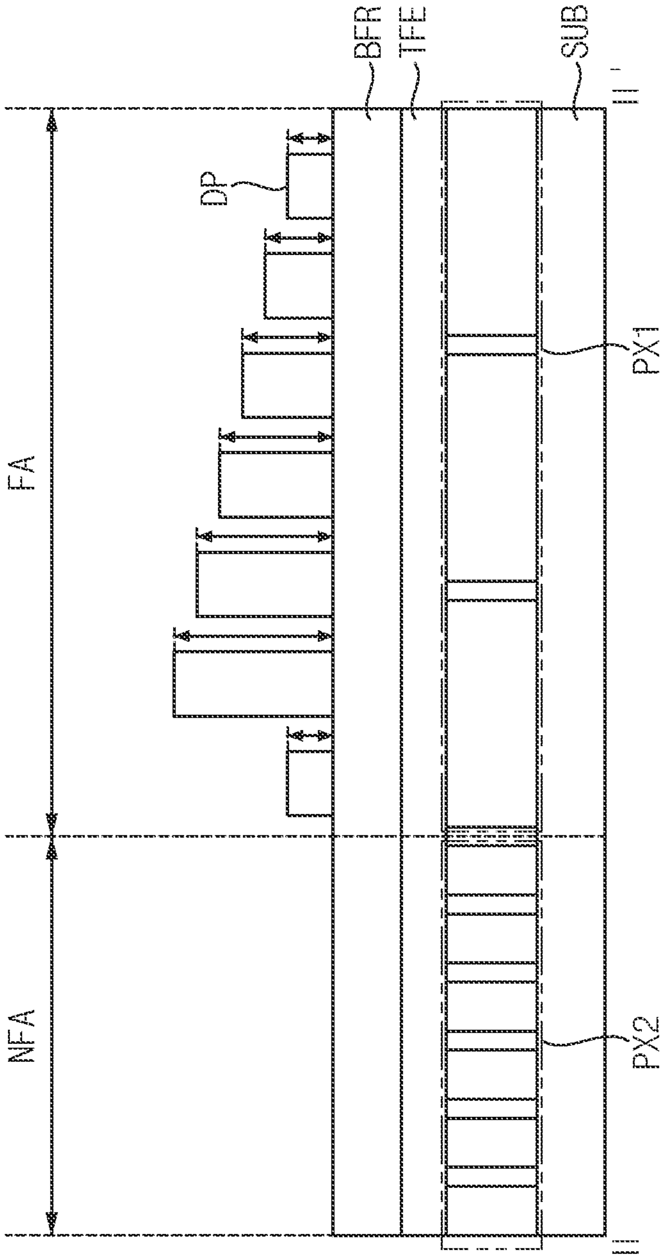
FIG. 8 is a cross-sectional view illustrating another example of FIG. 7 according to some embodiments of the present disclosure.

FIG. 8 is a cross-sectional view illustrating another example of FIG. 7. Hereinafter, a description overlapping the display device 10 described with reference to FIG. 7 will be omitted or simplified.

Referring to FIG. 8, the diffraction patterns DP may be arranged to be spaced apart from each other in the folding area FA on the buffer layer BFR. The diffraction patterns DP may be arranged or spaced at regular intervals in the folding area FA, but embodiments according to the present disclosure are not limited thereto.

According to some embodiments, heights of the diffraction patterns DP adjacent to the non-folding area NFA may be different from each other. In this case, the height may be a distance from first surface adjacent to the buffer layer BFR of each of the diffraction patterns DP to second surface spaced apart from the buffer layer BFR of each of the diffraction patterns DP.

The display device 10 according to some embodiments of the present disclosure may prevent or reduce instances of users recognizing or perceiving the boundary between the folding area FA and the non-folding area NFA by varying the heights of the diffraction patterns DP adjacent to the non-folding area NFA in the folding area FA.

Figure 9:
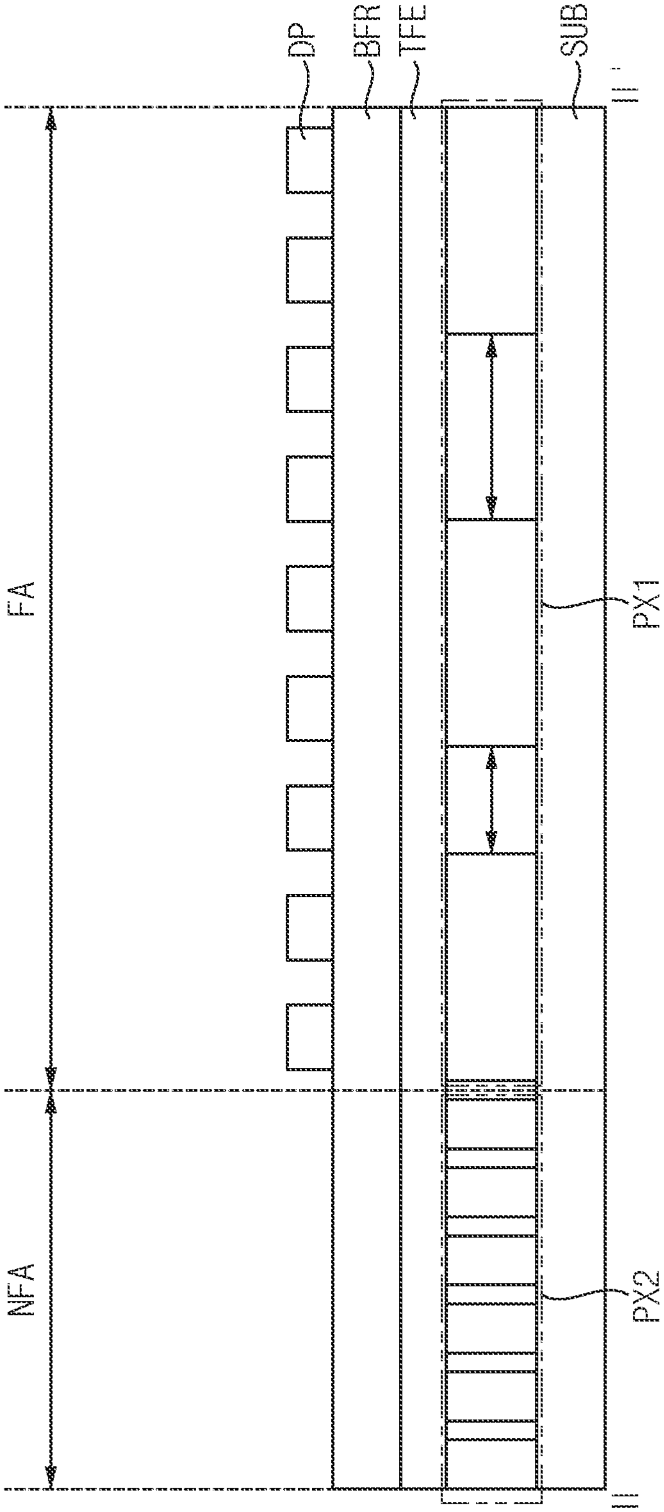
FIG. 9 is a cross-sectional view illustrating still another example of FIG. 7 according to some embodiments of the present disclosure.

FIG. 9 is a cross-sectional view illustrating still another example of FIG. 7. Hereinafter, a description overlapping the display device 10 described with reference to FIG. 7 will be omitted or simplified.

Referring to FIG. 9, the diffraction patterns DP may be arranged to be spaced apart from each other in the folding area FA on the buffer layer BFR. The diffraction patterns DP may be arranged or spaced apart at regular intervals in the folding area FA, but embodiments according to the present disclosure are not limited thereto.

According to some embodiments, an interval at which the first pixels PX1 are arranged or spaced apart may gradually decrease as it approaches (e.g., in a direction toward) the non-folding area NFA.

The display device according to some embodiments of the present disclosure may prevent or reduce instances of a user recognizing or perceiving the boundary between the folding area FA and the non-folding area NFA by decreasing the interval between the first pixels PX1 in the folding area FA as it approaches the non-folding area NFA.

Figure 10:
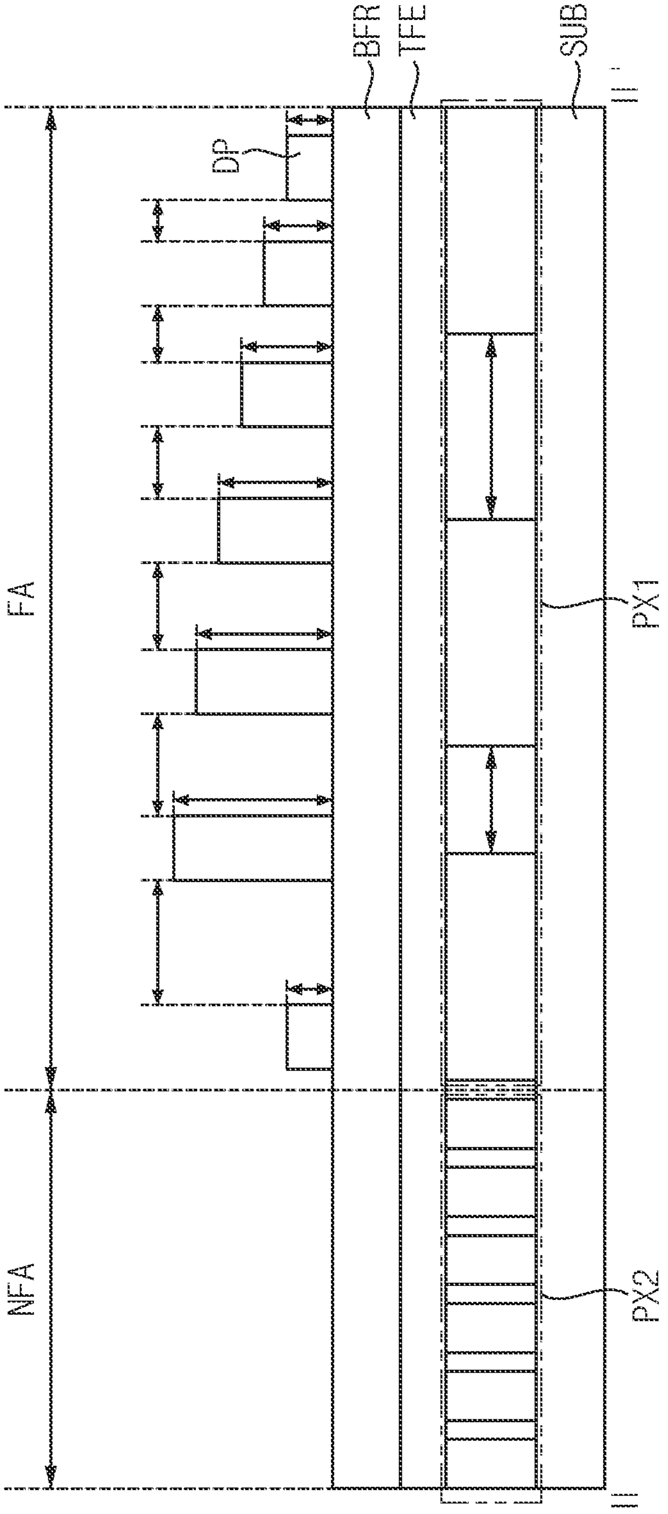
FIG. 10 is a cross-sectional view illustrating still another example of FIG. 7 according to some embodiments of the present disclosure.

FIG. 10 is a cross-sectional view illustrating still another example of FIG. 7. Hereinafter, a description overlapping the display device 10 described with reference to FIGS. 7, 8 and 9 will be omitted or simplified.

Referring to FIG. 10, an interval at which the diffraction patterns DP are arranged or spaced apart may gradually increase as it approaches (e.g., in a direction toward) the non-folding area NFA. In addition, heights of the diffraction patterns DP adjacent to the non-folding area NFA may be different from each other. In addition, an interval at which the first pixels PX1 are arranged or spaced apart may gradually decrease as it approaches (e.g., in a direction toward) the non-folding area NFA.

The display device 10 according to some embodiments of the present disclosure may include the first pixels PX1 located in the folding area FA, the second pixels PX2 located in the non-folding area NFA, the diffraction patterns DP located in the folding area FA and the window WD including the grooves GR in the folding area FA. The light emitting area of each of the first pixels PX1 may be larger than the light emitting area of each of the second pixels PX2, and the width W2 of the light emitting area of each of the first pixels PX1 in the first direction DR1 may be greater than the width W1 of each of the grooves GR in the first direction DR1.

Accordingly, the moire phenomenon in the folding area FA may be improved. In addition, by arranging the diffraction patterns DP on the first pixels PX1 in the folding area FA, a problem of lowering a resolution of the folding area FA may be improved. In addition, by selectively changing the interval of the diffraction patterns DP, the interval of the first pixels PX1 and the heights of the diffraction patterns DP, it may be possible to prevent or reduce instances of the user recognizing or perceiving the boundary between the folding area FA and the non-folding area NFA. Accordingly, display quality of the display device 10 may be improved.

Figure 11:
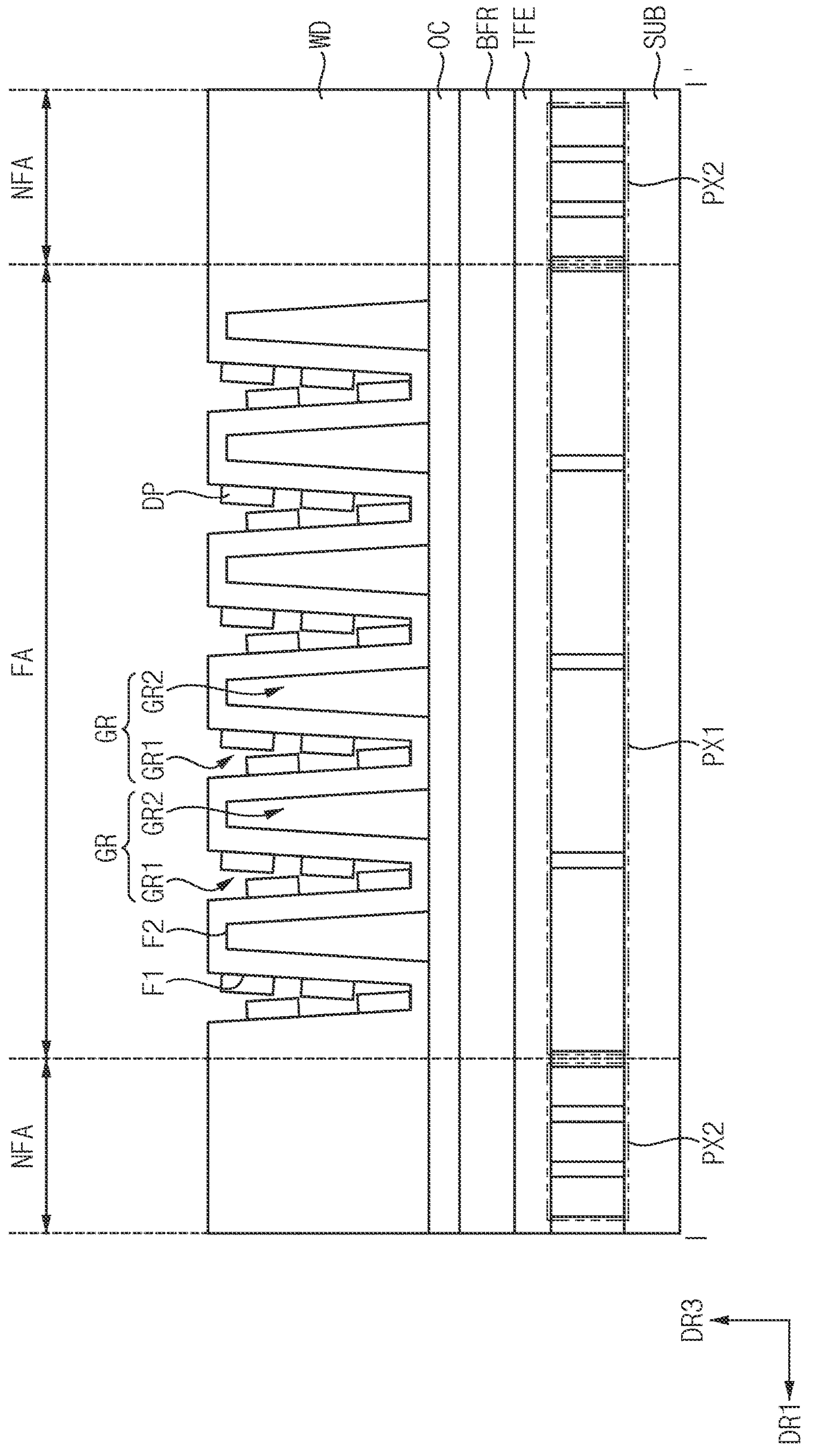
FIG. 11 is a cross-sectional view illustrating another example of FIG. 3 according to some embodiments of the present disclosure.
Figure 12:
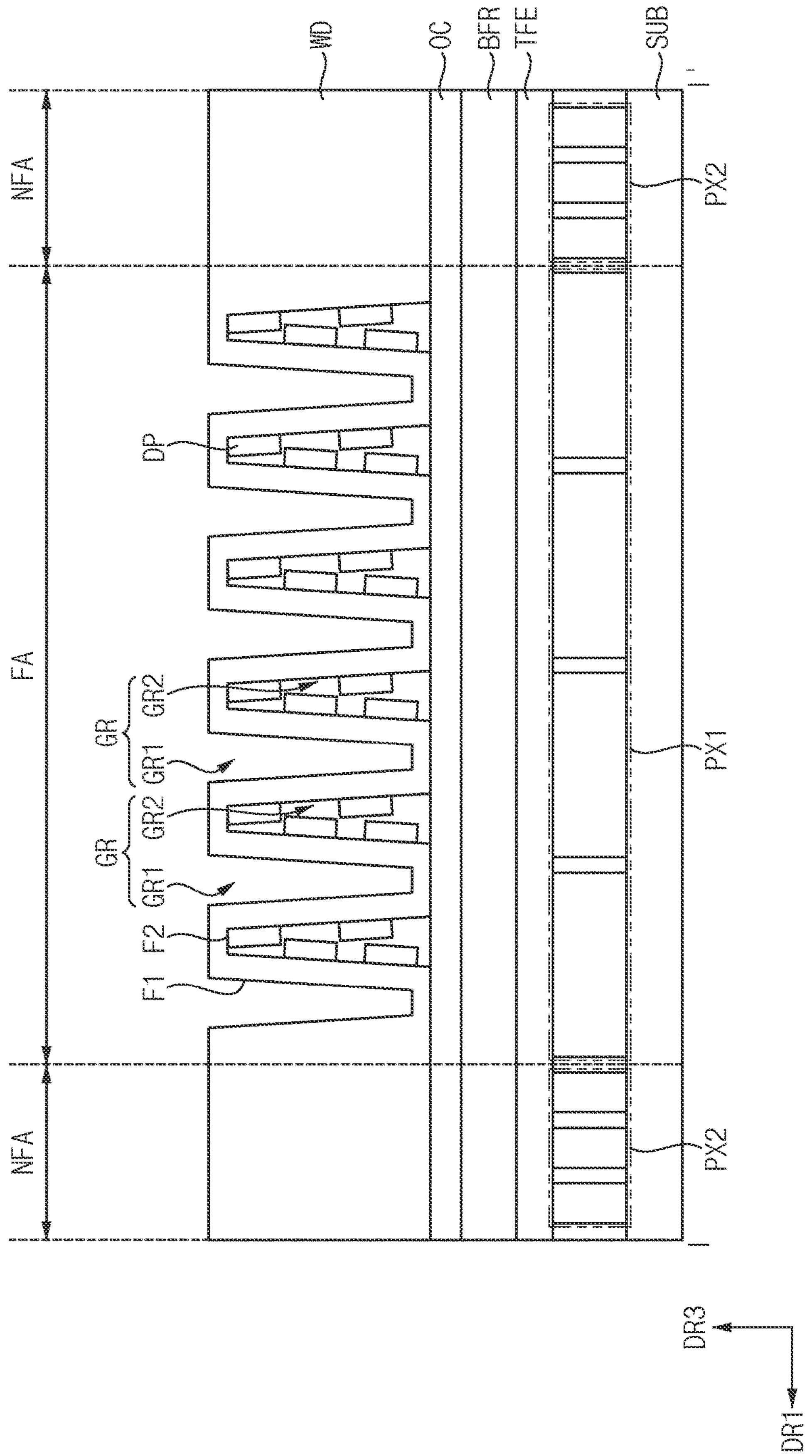
FIG. 12 is a cross-sectional view illustrating still another example of FIG. 3 according to some embodiments of the present disclosure.

FIG. 11 is a cross-sectional view illustrating another example of FIG. 3. FIG. 12 is a cross-sectional view illustrating still another example of FIG. 3. For example, FIGS. 11 and 12 may be cross-sectional views illustrating the display area DA of each of the folding area FA and the non-folding area NFA.

Hereinafter, a description overlapping the display device 10 described with reference to FIGS. 1 to 10 will be omitted or simplified.

Referring to FIGS. 11 and 12, the display device 10 may include the substrate SUB, the first pixels PX1, the second pixels PX2, the encapsulation layer TFE, the buffer layer BFR, the over-coating layer OC, the diffraction patterns DP and the window WD.

The first and second pixels PX1 and PX2, the encapsulation layer TFE, the buffer layer BFR and the over-coating layer OC may be sequentially arranged on the substrate SUB. The first pixels PX1 may be located in the folding area FA on the substrate SUB, and the second pixels PX2 may be located in the non-folding area NFA on the substrate SUB.

The window WD may be located on the over-coating layer OC. The window WD may include the grooves GR in the folding area FA. The window WD may include the first surface F1 and the second surface F2 facing the first surface F1.

According to some embodiments, the diffraction patterns DP may be located on the first surface F1 of the window WD in the folding area FA. For example, the diffraction patterns DP may be located on the first surface F1 along the grooves GR of the window WD.

According to some embodiments, the diffraction patterns DP may be located on the second surface F2 of the window WD in the folding area FA. For example, the diffraction patterns DP may be located on the second surface F2 along the grooves GR of the window WD.

The present disclosure can be applied to various display devices. For example, embodiments according to the present disclosure are applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and characteristics of embodiments according to the present disclosure. Accordingly, all such modifications are intended to be included within the scope of embodiments according to the present disclosure as defined in the claims, and their equivalents. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and their equivalents.

What is claimed is:

1. A display device comprising:

a substrate including a folding area and a non-folding area adjacent to the folding area;

a plurality of first pixels in the folding area on the substrate and each having a first light emitting area corresponding to where light is emitted by the first pixels in a plan view;

a plurality of second pixels in the non-folding area on the substrate and each having a second light emitting area corresponding to where light is emitted by the second pixels in the plan view, the second light emitting area having a size that is different from a size of the first light emitting area; and a window on the first and second pixels and including a plurality of grooves repeatedly arranged along a first direction in the folding area, and wherein each of the grooves includes a first groove formed from a first surface of the window toward a second surface of the window facing the first surface and a second groove formed from the second surface toward the first surface, and the first groove and the second groove are alternately arranged, wherein a width in the first direction of the first light emitting area is greater than a width in the first direction of each of the grooves.

2. The display device of claim 1, wherein the size of the first light emitting area is larger than the size of the second light emitting area.

3. The display device of claim 1, wherein an interval at which the first pixels are spaced gradually decreases toward the non-folding area.

4. The display device of claim 1, further comprising:

a plurality of diffraction patterns on the first pixels and spaced apart from each other.

5. The display device of claim 4, wherein an interval at which the diffraction patterns are spaced gradually increases toward the non-folding area.

6. The display device of claim 4, wherein heights of the diffraction patterns adjacent to the non-folding area are different from each other.

7. The display device of claim 4, wherein the diffraction patterns are on the first surface of the window.

8. The display device of claim 1, further comprising:

an encapsulation layer between the first and second pixels and the window.

9. The display device of claim 8, further comprising:

a buffer layer between the encapsulation layer and the window.

10. A display device comprising:

a substrate including a folding area and a non-folding area adjacent to the folding area;

a plurality of diffraction patterns in the folding area on the substrate and spaced apart from each other; and a window on the substrate and including a plurality of grooves repeatedly arranged along a first direction in the folding area, wherein the plurality of grooves overlap one or more of the diffraction patterns in a plan view, and wherein each of the grooves includes a first groove formed from a first surface of the window toward a second surface of the window facing the first surface and a second groove formed from the second surface toward the first surface, and the first groove and the second groove are alternately arranged.

11. The display device of claim 10, wherein an interval at which the diffraction patterns are spaced gradually increases toward the non-folding area.

12. The display device of claim 10, wherein heights of the diffraction patterns adjacent to the non-folding area are different from each other.

13. The display device of claim 10, wherein the diffraction patterns are on the first surface of the window.

14. The display device of claim 10, further comprising:

a plurality of first pixels in the folding area on the substrate and each having a first light emitting area; and a plurality of second pixels in the non-folding area on the substrate and each having a second light emitting area having a size that is different from a size of the first light emitting area.

15. The display device of claim 14, wherein the size of the first light emitting area is larger than the size of the second light emitting area.

16. The display device of claim 14, wherein a width in the first direction of the first light emitting area is greater than a width in the first direction of each of the grooves.

17. The display device of claim 14, wherein an interval at which the first pixels are spaced gradually decreases toward the non-folding area.

18. The display device of claim 10, further comprising:

an encapsulation layer between the substrate and the window.

19. The display device of claim 18, further comprising:

a buffer layer between the encapsulation layer and the window.

* * * * *